(12) United States Patent
Cha et al.

(10) Patent No.: US 9,298,039 B2
(45) Date of Patent: Mar. 29, 2016

(54) BACKLIGHT UNIT AND DISPLAY DEVICE INCLUDING THE SAME

(71) Applicant: Samsung Display Co., Ltd., Yongin, Gyeonggi-Do (KR)

(72) Inventors: HanMoe Cha, Anyang-si (KR); Seung-Hwa Ha, Osan-si (KR); Kyung-Min Kim, Hwaseong-si (KR); Donghoon Kim, Suwon-si (KR); Young-Jun Seo, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 287 days.

(21) Appl. No.: 14/016,326

(22) Filed: Sep. 3, 2013

(65) Prior Publication Data

US 2014/0286049 A1 Sep. 25, 2014

(30) Foreign Application Priority Data

Mar. 25, 2013 (KR) ........................ 10-2013-0031491

(51) Int. Cl.
*F21V 8/00* (2006.01)
*G02F 1/1335* (2006.01)
*B82Y 20/00* (2011.01)
*H01L 33/50* (2010.01)

(52) U.S. Cl.
CPC ........ *G02F 1/133615* (2013.01); *G02B 6/0023* (2013.01); *B82Y 20/00* (2013.01); *H01L 33/502* (2013.01); *H01L 33/507* (2013.01); *Y10S 977/744* (2013.01); *Y10S 977/95* (2013.01)

(58) Field of Classification Search
CPC ..... H01L 33/50–33/58; G02B 6/0023–6/0025; Y10S 977/744; Y10S 977/95; B82Y 20/00
USPC .......................................... 362/231, 613, 235
See application file for complete search history.

(56) References Cited

U.S. PATENT DOCUMENTS

| | | | |
|---|---|---|---|
| 8,262,261 B2* | 9/2012 | Rossi ............................. | 362/294 |
| 2011/0220870 A1* | 9/2011 | Sulaiman et al. ............... | 257/13 |
| 2013/0194783 A1* | 8/2013 | Kang ............................. | 362/97.1 |
| 2014/0240644 A1* | 8/2014 | Abe ................................ | 349/71 |

FOREIGN PATENT DOCUMENTS

KR 1020100046698 A 5/2010

* cited by examiner

*Primary Examiner* — Anabel Ton
(74) *Attorney, Agent, or Firm* — Cantor Colburn LLP

(57) ABSTRACT

A backlight unit includes a light source which generates a first light; a quantum dots member which is spaced apart from the light source by a first distance and converts the first light into a second light; a guide member which lengthwise extends in a first direction and fixes positions of the light source and the quantum dots member; and an optical member which reflects the second light. The guide member guides the first light from the light source to the quantum dots member and guides the second light from the quantum dots member to the optical member.

35 Claims, 8 Drawing Sheets

BACKLIGHT UNIT AND DISPLAY DEVICE INCLUDING THE SAME

This application claims priority to Korean Patent Application No. 10-2013-0031491, filed on Mar. 25, 2013, and all the benefits accruing therefrom under 35 U.S.C. §119, the entire contents of which are hereby incorporated by reference.

BACKGROUND (1) Field

The invention herein relates to a backlight unit and a display device including the same.

(2) Description of the Related Art

Various display devices such as a liquid crystal display device, an electro wetting display device and an electrophoretic display device, etc. have been being developed.

A general display device includes a display panel generating an image and a backlight unit supplying light to the display panel. The display panel displays the image by controlling a transmittance of the light provided from the backlight unit.

A backlight unit may be classified into an edge-type providing light to a display panel from a side of the display panel, and a direct-type providing light to a display panel from below the display panel. The edge-type backlight unit includes a light source generating light and a light guide plate guiding a direction of the light. The light guide plate is disposed below the display panel. The light source is disposed to face a side of the light guide plate. Light generated by the light source may be white light. The light guide plate guides the light generated by the light source to the display panel.

SUMMARY

One or more exemplary embodiment of the invention provides a backlight unit.

One or more exemplary embodiment of the invention also provides a display device including the backlight unit.

An exemplary embodiment of a backlight unit includes a light source which generates a first light; a quantum dots member which is spaced apart from the light source by a first distance and converts the first light into a second light; a guide member which lengthwise extends in a first direction and fixes positions of the light source and the quantum dots member; and an optical member which reflects the second light. The guide member guides the first light from the light source to the quantum dots member and guides the second light from the quantum dots member to the optical member.

An exemplary embodiment of a display device includes a display panel which generates an image by controlling a penetration ratio of light; and a backlight unit which is at a lower portion of the display panel and provides the light to the display panel. The backlight unit includes a light source which generates a first light; a quantum dots member which is spaced apart from the light source by a first distance and redirects the first light into a second light; a guide member which lengthwise extends in a first direction and fixes positions of the light source and the quantum dots member; an optical member which reflects the second light; and an optical sheet which is above the guide member and the optical member, converts the second light into the light and provides the light to the display panel. The guide member guides the first light from the light source to the quantum dots member and guides the second light from the quantum dots member to the optical member.

BRIEF DESCRIPTION OF THE FIGURES

The above and other features of the invention will be described below in more detail with reference to the accompanying drawings, in which.

DETAILED DESCRIPTION

Figure 1:
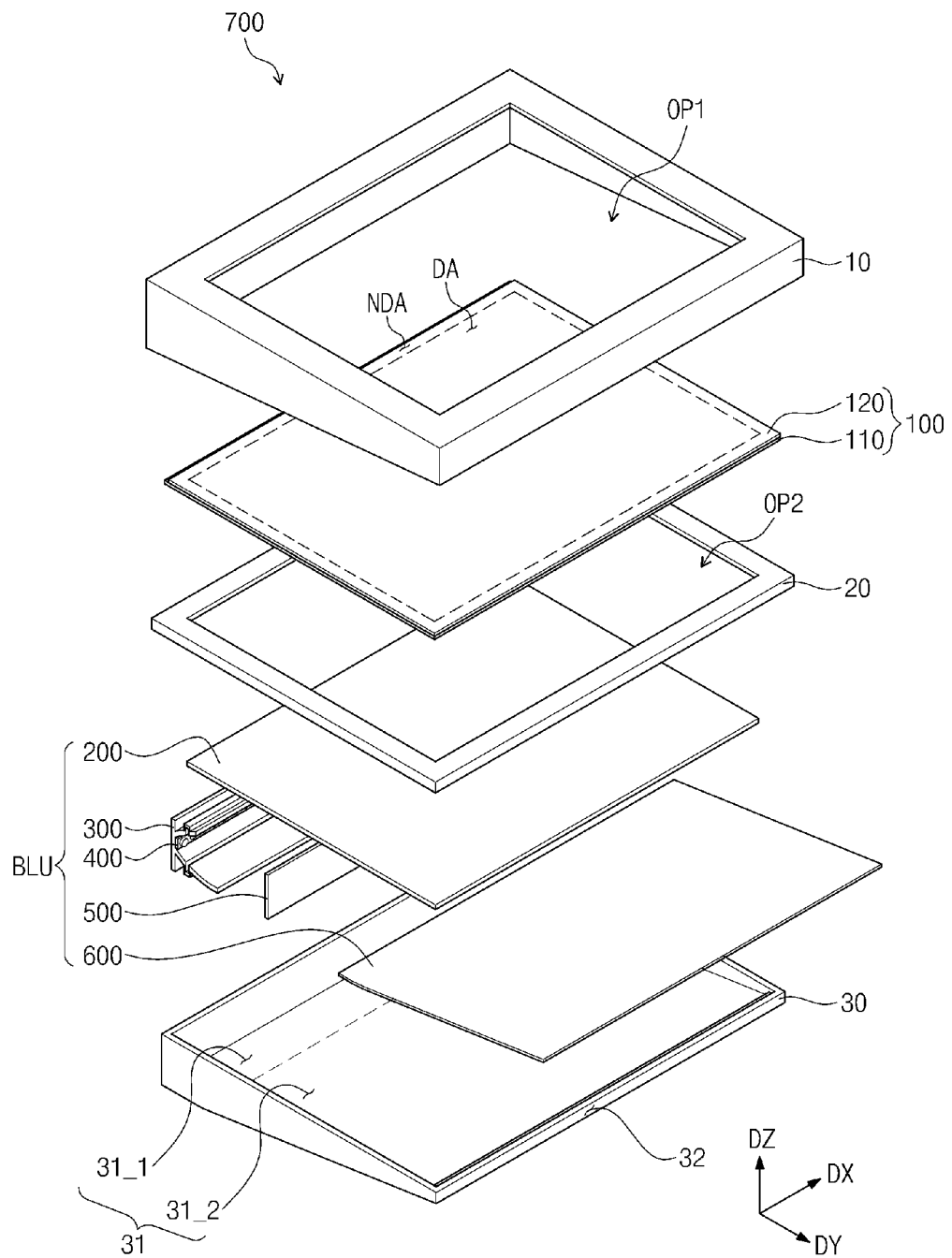
FIG. 1 is an exploded perspective view of an exemplary embodiment of a display device in accordance with the invention.

The invention may, however, be embodied in different forms and should not be construed as limited to the exemplary embodiments set forth herein.

Rather, these exemplary embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "under" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be explained in detail with reference to the accompanying drawings.

Figure 2:
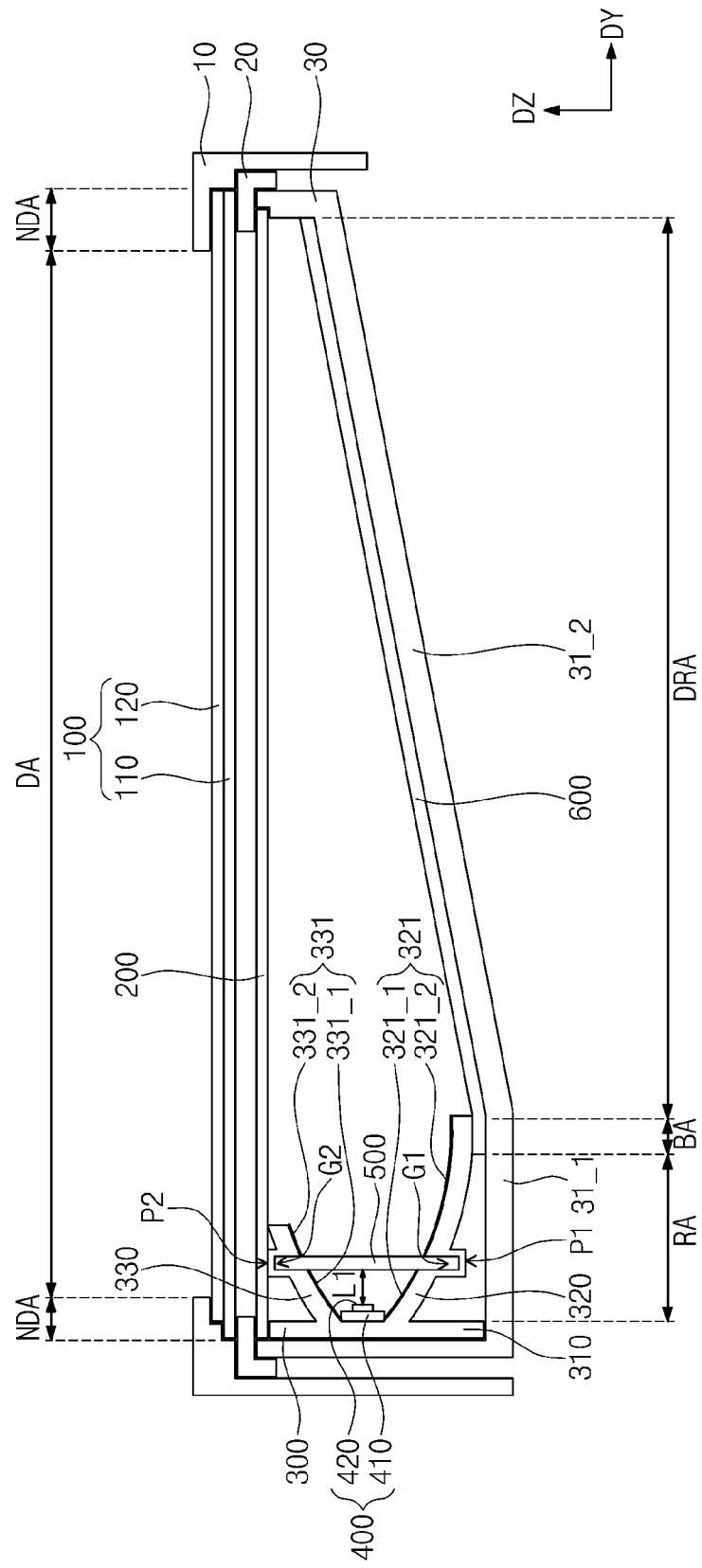
FIG. 2 is a cross-sectional view of the display device taken along a second direction DY illustrated in FIG. 1.

FIG. 1 is an exploded perspective view of an exemplary embodiment of a display device in accordance with the invention. FIG. 2 is a cross-sectional view of the display device taken along a second direction DY illustrated in FIG. 1.

Referring to FIGS. 1 and 2, the display device 700 includes a display panel 100, a backlight unit BLU generating and providing light to the display panel 100, and protection members 10, 20 and 30 accommodating and protecting the display panel 100 and the backlight unit BLU therein.

The display panel 100 may have a substantially rectangular shape in a top plan view. A longer side direction of the display panel 100 may be defined as a first direction DX. A shorter side direction of the display panel 100 may be defined as a second direction DY perpendicular to the first direction DX. That is, the display panel 100 has a longer side in the first direction DX and a shorter side in the second direction DY. A normal direction with respect to the display panel 100 may be defined as a third direction DZ. The third direction DZ may be defined as a direction perpendicular to both the first direction DX and the second direction DY.

A planar area of the display panel 100 includes a display area DA on which an image is displayed, and a non-display area NDA disposed in the vicinity of or around the display area DA. The non-display area NDA may be defined as an area on which an image is not generated or displayed.

The display panel 100 generates an image by controlling a transmittance of the light generated and provided from the backlight unit BLU. The generated image is displayed at the display area DA of the display panel 100 to be provided to an observer at a front or viewing side of the display device 700.

The display panel 100 may be a transparent display panel or a semi-transparent display panel. The display panel 100 may be a liquid crystal display panel, an electrophoretic display panel or an electrowetting display panel, but is not limited thereto or thereby.

For purpose of illustration, the display panel 100 is described as a liquid crystal display panel. Thus, the display panel 100 may include a first substrate 110, a second substrate 120, and a liquid crystal layer (not shown) disposed between the first substrate 110 and the second substrate 120.

The backlight unit BLU is disposed at a rear side of display panel 100, opposite to the front side of the display device 700. The backlight unit BLU generates a light. The light generated from the backlight unit BLU may be white light, but is not limited thereto or thereby. The light generated from the backlight unit BLU is provided to the display panel 100. As described above, the transmittance of the light provided to the display panel 100 is controlled and thereby an image is displayed.

The backlight unit BLU includes an optical sheet 200, a guide member 300, a light source 400, a quantum dots member 500 and an optical member 600. The optical sheet 200 is disposed below the display panel 100. The guide member 300, the light source 400, the quantum dots member 500 and the optical member 600 are disposed below the optical sheet 200.

The optical sheet 200 may include a prism sheet (not shown) disposed below the display panel 100 and/or a diffusion sheet (not shown) disposed below the prism sheet. The diffusion sheet diffuses the light provided from the optical member 600. The prism sheet concentrates a path of the light diffused in the diffusion sheet to be in directed in the third direction DZ and perpendicular to a plane of the display panel 100. The light which passes through the prism sheet vertically travels to have a uniform brightness distribution and is provided to the display panel 100.

The light source 400 is fixed to the guide member 300. The quantum dots member 500 is spaced apart from the light source 400 by a first distance L1 in the second direction DY and is also fixed to the guide member 300. The guide member 300 lengthwise extends in the first direction DX. The guide member 300 is disposed on one side of the display device 700. In one exemplary embodiment, the guide member 300 may be disposed at only one side of the display device 700, but is not limited thereto or thereby. The guide member 300 includes a non-conductive and relatively lightweight material such as a plastic resin. In one exemplary embodiment, the guide member 300 may be manufactured through an injection molding, a compression molding and/or an extrusion molding process.

The light generated by the light source 400 is changed to white light while passing through the quantum dots member 500. The guide member 300 guides the initial light generated by the light source 400 to provide the initial light to the quantum dots member 500. The guide member 300 guides the white light generated by the quantum dots member 500 to provide the white light to the optical member 600.

The guide member 300 includes a body part 310, a first reflection part 320 and a second reflection part 330. The body part 310 has a planar shape which lengthwise extends in the first direction DX. A width of the body part may be taken in the third direction DX, while a thickness extends in the second direction DY. The body part 310 is disposed on one side of the display device 700. The first reflection part 320 and the second reflection part 330 have the same length as the body part 310 in the first direction DX and are connected to the inside of the body part 310, such as being extended from an inner surface of the body part 310. The body part 310, the first reflection part 320 and the second reflection part 330 may be integral with each other, such as to form a single, unitary, indivisible member.

The first reflection part 320 and the second reflection part 330 guide the initial light generated by the light source 400 in the second direction DY which is perpendicular to the first direction DX, to provide the initial light to the quantum dots member 500. The first reflection part 320 and the second reflection part 330 guide the white light generated by the quantum dots member 500 in the second direction DY to provide the white light to the optical member 600.

A first side of the first reflection part 320 and a first side of the second reflection part 330 are disposed adjacent to each other and extend from the inner surface of the body part 310. The first reflection part 320 and the second reflection part 330 extend a distance greater than the first length L1 along the second direction DY. As a distance from the body part 310 increases, the first reflection part 320 and the second reflection part 330 are spaced further apart from each other in the third direction DZ.

The first reflection part 320 extends further than the second reflection part 330. A distal second side of the first reflection part 320 is further from the body part 310 than a distal second side of the second reflection part 330. The first reflection part 320 and the second reflection part 330 may extend from the body part 310 to have a curved shape. A top surface of the first reflection part 320 faces a bottom surface of the second reflection part 330. A predetermined planar area of the top surface of the first reflection part 320 taken from the inside of the body part 310 is disposed to face the bottom surface of the second reflection part 330.

The light source 400 is fixed to an inner side of the body part 310 between the first sides of the first reflection part 320 and the second reflection part 330. The quantum dots member 500 is spaced apart from the light source at the first distance L1 taken along the second direction DY and is fixed to the first reflection part 320 and the second reflection part 330.

The first reflection part 320 includes a first protrusion part P1 and a first reflection surface 321, and a first groove G1 is defined therein. The second reflection part 330 includes a second protrusion part P2 and a second reflection surface 331, and a second groove G2 is defined therein.

The first groove G1 is spaced the first distance L1 apart from the light source 400 along the second direction DY and is recessed downward from the top surface of the first reflection part 320. The first protrusion part P1 overlaps the first groove G1 and protrudes downward from a bottom surface of the first reflection part 320. The first protrusion part P1 may define a portion of the first groove G1.

The second groove G2 is spaced the first distance L1 apart from the light source 400 along the second direction DY and is recessed upward from the bottom surface of the second reflection part 330. The second protrusion part P2 overlaps the second groove G2 and protrudes upward from a top surface of the second reflection part 230. The second protrusion part P2 may define a portion of the second groove G2.

In the illustrated exemplary embodiment, the first and second grooves G1 and G2 are spaced the same distance apart from the light source 400 in the second direction DY, but the invention is not limited thereto. The first and second grooves G1 and G2 may be spaced from the light source 400 at different distances from each other. In one exemplary embodiment, for example, the first groove G1 may be spaced at the first distance L1 from the light source 400 along the second direction DY and the second groove G2 may be spaced apart from the light source 400 at a distance greater or smaller than the first distance L1 along the second direction DY.

A bottom surface of the first groove G1 and a bottom surface of the first protrusion part P1 are parallel to each other. A top surface of the second groove G2 and a top surface of the second protrusion part P2 are parallel to each other. The top surface of the second groove G2 and the top surface of the second protrusion part P2 are parallel to a plane of the optical sheet 200.

The quantum dots member 500 is disposed to be perpendicular to a plane of the display panel 100 and lengthwise extends in the first direction DX. The quantum dots member 500 may have substantially the same length as the body part 310 along the first direction DX.

The quantum dots member 500 is fixed in the guide member 300 by the first groove G1 and the second groove G2. A predetermined area of the quantum dots member 500 is inserted into the first groove G1 at a lower boundary surface of the quantum dots member 500. A predetermined area of the quantum dots member 500 is inserted into the second groove G2 at an upper boundary surface of the quantum dots member 500. According to the structure described above, the quantum dots member 500 and the light source 400 is disposed to face each other and may be fixed in positions relative to each other by the guide member 300.

The quantum dots member 500 is disposed to be spaced apart from the light source 400 at the first distance L1. If a distance between the light source 400 and the quantum dots member 500 is reduced, the quantum dots member 500 may be deteriorated and/or damaged by heat generated by the light source 400. The first distance L1 may be set to a distance at which the quantum dots member 500 is not deteriorated and not damaged by the heat generated by the light source 400. In one exemplary embodiment, for instance, the first distance L1 may be set to be equal to or greater than 0.3 millimeter (mm).

The first reflection surface 321 is disposed on a top surface of the first reflection part 320 except for an area in which the first groove G1 is defined. The second reflection surface 331 is disposed on a bottom surface of the second reflection part 330 except for an area in which the second groove G2 is defined.

The first reflection surface 321 and the second reflection surface 331 may be members including a mirror reflective material. The first and second reflection surfaces 321 and 331 may be considered a layer of reflective material. The first reflection surface 321 and the second reflection surface 331 mirror-reflect incident light to guide the incident light toward the second direction DY. The first and second reflection surfaces 321 and 331 may be metal layers including metal such as silver (Ag). The light reflected from the first reflection surface 321 and the second reflection surface 331 is guided to be substantially parallel to a plane of the display panel 100 and toward the second direction DY.

Figure 3:
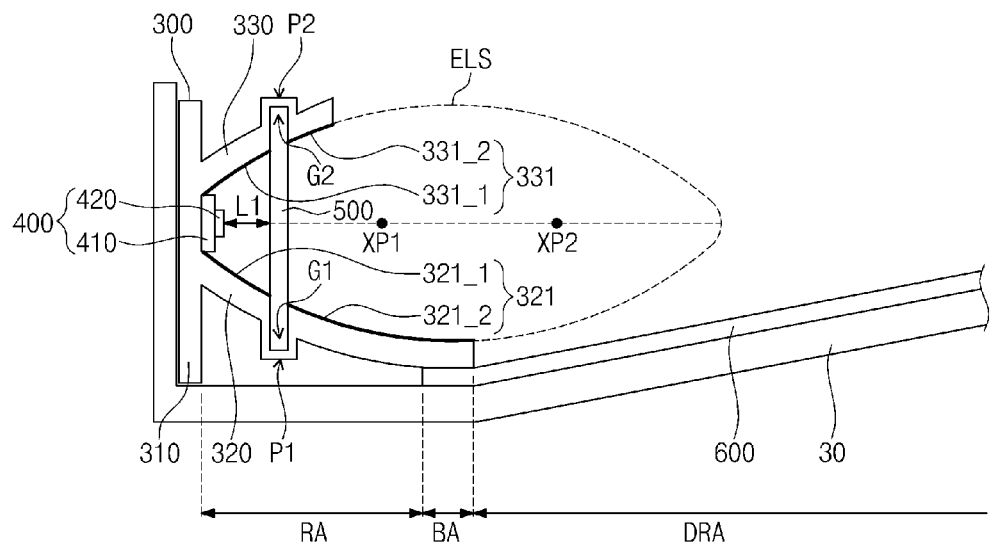
FIG. 3 is an enlarged cross-sectional view of an exemplary embodiment of a guide member illustrated in the display device FIG. 1.

As illustrated in FIG. 3, to improve linearity of the light reflected from the first reflection surface 321 and the second reflection surface 331, the first reflection surface 321 and the second reflection surface 331 can be virtually extended to form an ellipse ELS on a plane taken along the third direction DZ. The light source 400 may be disposed on a major axis line of the ellipse ELS. The major axis line is a virtual line connecting focal points XP1 and XP2 of the ellipse ELS.

The first reflection surface 321 includes a first sub-reflection surface 321_1 disposed between the first side of the first reflection part 320 and the first groove G1, and a second sub-reflection surface 321_2 disposed between the distal second side of the first reflection part 320 and the first groove G1. The second reflection surface 331 includes a third sub-reflection surface 331_1 disposed between the first side of the second reflection part 330 and the second groove G2, and a fourth sub-reflection surface 331_2 disposed between the distal second side of the second reflection part 330 and the second groove G2.

The light generated by the light source 400 may be mirror-reflected by the first sub-reflection surface 321_1 and the third sub-reflection surface 331_1 to be guided in the second direction DY. Thus, the light generated by the light source 400 may be provided to the quantum dots member 500.

The quantum dots member 500 converts the light generated by the light source 400 into the white light to emit the white light. The white light emitted from the quantum dots member 500 may be mirror-reflected by the second sub-reflection surface 321_2 and the fourth sub-reflection surface 331_2 to be guided in the second direction DY. Thus, the white light emitted from the quantum dots member 500 may be provided to the optical member 600.

The light source 400 includes a circuit substrate 410, and a plurality of light source units 420 mounted on the circuit substrate 410. The circuit substrate 410 includes one or more insulating layer (not shown) and one or more circuit layer (not shown). The light source units 420 may include a blue light emitting diode ("LED") generating blue light, but is not limited thereto.

The light source units 420 are provided with a dimming signal and a drive voltage from the circuit substrate 410 to generate light. The light source units 420 are disposed to be spaced a predetermined distance apart from each other along the first direction DX.

The quantum dots member 500 converts the light generated by the light source units 420 of the light source 400 into the white light. The quantum dot member 500 includes quantum dots. The quantum dots randomly change a wavelength band of light and mix light having different wavelength bands to emit the mixed light.

A quantum dot may be defined as a particle of a predetermined size having a quantum confinement effect. The quantum dot has a size of about 2 nanometers (nm) to about 15 nanometers (nm). The quantum dot includes a central body, and a skin surrounding the central body. The central body of the quantum dot may include cadmium selenide (CdSe), cadmium telluride (CdTe), cadmium sulfide (CdS), etc. The skin of the quantum dot may include zinc sulfide (ZnS).

In one exemplary embodiment, the quantum dot may be formed by a wet-chemical method. The wet-chemical method is a method in which a precursor material is put into an organic solvent to grow a particle. A synthesis method of forming the quantum dot by a wet-chemical method may be performed by various conventional methods.

The quantum dot generates a strong fluorescence in a narrow wavelength band. Light emitted by the quantum dot is generated while an electron of an unstable state moves from a conduction band to a valence band.

The fluorescence being generated by the quantum dot generates light of a short wavelength if a particle of the quantum dot is relatively small and generates light of a long wavelength if the particle of the quantum dot is relatively large. Thus, light of various wavelengths may be generated according to a quantum size effect.

According to a size of the quantum dot, light having a rainbow color including red, green and blue may be easily generated. An LED which is light-emitting according to a quantum dot size may be manufactured, and white and various colors may be realized by mixing quantum dots having various sizes.

The quantum dot has a high light emitting characteristic. Where white light is realized using the quantum dot, a color reproduction ratio of green and red becomes high as compared with a conventional white LED.

The quantum dots member 500 includes the quantum dots having different sizes depending on the type of the light source 400 to generate white light. As described above, the light source units 420 may include a blue LED generating blue light. Where the light source units 420 include a blue LED generating blue light, the quantum dots member 500 may include quantum dots of a first size absorbing light of a blue wavelength band to emit light of a green wavelength band and quantum dots of a second size absorbing light of a blue wavelength band to emit light of a red wavelength band.

The blue light generated by the light source units 420 is provided to the quantum dots member 500. The quantum dots of the quantum dots member 500 absorb the blue light to convert the blue light into light of the green color or red color wavelength band. As a result, the light of the blue, green and red wavelengths are mixed to emit the white light. The blue light generated by the light source 400 is converted into the white light by passing through the quantum dots member 500. The white light generated by the quantum dots member 500 is provided to the optical member 600.

A predetermined area of a first side of the optical member 600 may overlap a predetermined area of the distal second side of the first reflection part 320. As illustrated in FIG. 2, a predetermined area at the left of the optical member 600 overlaps a predetermined area of the distal second side at the right of the first reflection part 320. The predetermined area of the first side of the optical member 600 may be disposed under the predetermined area of the distal second side of the first reflection part 320. However, the invention is not limited thereto. A predetermined area of one side of the optical member 600 may be disposed on a predetermined area of the other side of the first reflection part 320.

An area of the first reflection part 320 taken from the inner surface of the body part 310 of the guide member 300 to a boundary at the first side of the optical member 600 may be defined as a reflection area RA. A predetermined area of the first reflection part 320 taken from the first side of the optical member 600, extending to the distal second end of the first reflection part and overlapping the optical member 600, may be defined as a boundary area BA. An area of the optical member 600 not overlapping the predetermined areas of the first reflection part 320 may be defined as a diffusion reflection area DRA.

The first reflection part 320 guides the blue light generated by the light source 400 and the white light generated by the quantum dots member 500 toward the second direction DY in the reflection area RA and in the boundary area BA. The white light guided toward the second direction DY is provided to the optical member 600.

The optical member 600 replaces a light guide plate of a conventional backlight unit. The optical member 600 may be defined as a diffusion reflection member. The optical member 600 diffuses and reflects the light generated by the quantum dots member 500 and guides the light toward the second direction DY. The white light diffused and reflected by the optical member 600 is provided to the optical sheet 200.

As described above, the optical sheet 200 diffuses the white light provided from the optical member 600 and concentrates the white light in the third direction DZ to provide the white light to the display panel 100.

The protection members 10, 20 and 30 may include various materials such as a metallic material and/or a resin material. The protection members 10, 20 and 30 may include a first protection member 10, a second protection member 20 and a third protection member 30. The first protection member 10 and the third protection member 30 are combined with each other. The second protection member 20 is disposed between the first protection member 10 and the third protection member 30.

The frame-shaped first protection member 10 is disposed at an upper portion of the display panel 100. The first protection member 10 includes a first open area OP1 corresponding to the display area DA of the display panel 100. The first protection member 10 is disposed to overlap the non-display area NDA of the display panel 100. Thus, the display area DA of the display panel 100 is exposed by the first open area OP1. The first protection member 10 may include a top plate part parallel to a plane of the display panel 100, and one or more sidewall extended from a rear surface of the top plate part and toward the third protection member 30. The first open area OP1 may be defined in the top plate part. The top plate part and the sidewall of the first protection part 10 may be integral with each other such as to form a single, unitary, indivisible member.

The second protection member 20 supports the non-display area NDA of the display panel 100. The second protection member 20 can absorb a shock applied to the display panel 100 and may include a non-conductive and/or elastic material such as plastic which is relatively easily formed in a manufacturing process. The second protection member 20 may be a frame-shaped member having a substantially rectangular shape. The second protection member 20 includes a second open area OP2 corresponding to (e.g., aligned with) the first open area OP1. The second open area OP2 may have a greater planar area than the first open area OP1. In an alternative exemplary embodiment, the second protection member 20 may be omitted. Where the second protection member 20 is omitted, the display panel 100 may be supported by the third protection member 30.

The third protection member 30 accommodates the guide member 300 and the optical member 600 therein. The third protection member 300 supports and overlaps a predetermined area of the optical sheet 200. The third protection member 30 includes a bottom part 31, and a sidewall part 32 upwardly extended from the bottom part 31. The bottom part 31 and the sidewall part 32 of the third protection part 30 may be integral with each other such as to form a single, unitary, indivisible member. The optical sheet 200 is supported by the guide member 300 and the sidewall part 32 of the third protection member 30 to be parallel to the display panel 100. At a first side of FIG. 2, the guide member 300 faces a lower surface of the optical sheet 200, where at a right side, the third protection member 30 faces the lower surface of the optical sheet 200.

The bottom part 31 of the third protection member 30 may have a substantially rectangular shape in the top plan view. The sidewall part 32 of the third protection member 30 is extended in the third direction DZ from each of four sides of the bottom part 31. The bottom part 31 includes a flat surface area 31_1 extending in the second direction DY from the sidewall part 32, and an oblique area 31_2 inclined at a predetermined angle in the third direction DZ with respect to the flat surface area 31_1.

The flat surface area 31_1 of the third protection member 30 is disposed to overlap a bottom of the body part 310 in the reflection area RA and the boundary area BA. The oblique area 31_2 of the third protection member 30 is disposed at the diffusion reflection area DRA.

The body part 310 of the guide member 300 is disposed at the sidewall part 32 extended from the sidewall part 32 corresponding to the flat surface area 31_1 among four sides of the bottom part 31 of the third protection member 30. The optical member 600 is disposed at the bottom part 31 of the third protection member 30 corresponding to the boundary area BA and the diffusion reflection area DRA.

In an exemplary embodiment of a manufacturing process of the display device 700, a bulk part of the quantum dots member is made in a roll shape and a predetermined area of the bulk quantum dots member is separated to be used as the quantum dots member 500 of the invention. Where the predetermined area is separated from the bulk part, the separated cut area is exposed to external oxygen and moisture such that an undesirable chemical reaction may occur. An optical conversion characteristic of the final display device is degraded by the chemical reaction. The separated portion and a remainder of the bulk part include a boundary surface of the quantum dots member 500 facing each other. A predetermined area of the separated portion to be used as the quantum dots member 500, taken from the boundary surface is an area in which an optical conversion characteristic is degraded and may be defined as a defective area.

In a conventional backlight unit, a quantum dots member cut to fit the planar size of the optical sheet 200 may be disposed at a lower portion of the optical sheet 200. That is, an incident surface of the conventional quantum dots member may be substantially the same size as an incident surface of the optical sheet 200. Where the quantum dots member fits the planar size of the optical sheet 200, the light generated by the light source 400 is reflected from the first and second reflection parts 320 and 330 of the guide member 300 to be provided to the optical member 600. The optical member 600 diffuses and reflects the light provided from the light source 400 to provide the light to the quantum dots member. The quantum dots member of the conventional backlight unit converts the light provided from the optical member 600 into white light to provide the white light to the optical sheet 200. However, a normal optical conversion operation is not performed in the defective area of the quantum dots member in which is disposed the quantum dots of which an optical conversion characteristic is degraded. That is, in the conventional backlight unit, the light provided from the optical member 600 is not converted into the white light in the defective area of the quantum dots member. Where the blue light is generated in the light source 400, the defective area of the quantum dots member may not convert the blue light into the white light, such that the blue light is emitted. Thus, an optical conversion characteristic of the conventional backlight unit may be degraded.

However, in one or more exemplary embodiment of the invention, the predetermined area of the quantum dots member 500, in which is disposed the quantum dots of which an optical conversion characteristic is degraded, taken from the boundary surface (e.g., the cut edge) is inserted into the first groove G1 and the second groove G2. That is, the defective area of the quantum dots member 500 is inserted into the first groove G1 and the second groove G2.

The light generated by the light source 400 is not provided into the first groove G1 and the second groove G2. That is, the defective area of the quantum dots member 500 is inserted into the first groove G1 and the second groove G2, and is not provided with the light generated by the light source 400. Thus, the light generated by the light source 400 is not provided to the defective area of the quantum dots member 500. The light generated by the light source 400 is provided to the area of the quantum dots member 500 except the defective area of the quantum dots member 500. That is, the light generated by the light source 400 is provided only to the non-defective area of the quantum dots member 500.

Where the light generated by the light source 400 is the blue light, the defective area of the quantum dots member 500 is inserted into the first groove G1 and the second groove G2 to be blocked from the blue light and thereby the defective area is not provided with the blue light. Therefore, the defective area of the quantum dots member 500 does not perform an optical conversion operation.

The blue light generated by the light source 400 is provided to the non-defective area of the quantum dots member 500 except the defective area. The non-defective area of the quantum dots member 500 except the defective area normally performs an optical conversion operation to convert the blue light into white light.

The defective area of the quantum dots member 500 in which quantum dots of which an optical conversion characteristic is degraded are disposed, does not emit the blue light. The non-defective area of the quantum dots member 500 except the defective area converts the blue light into white light to emit the white light. Thus, in one or more exemplary embodiment of the invention, an optical conversion characteristic of the backlight unit BLU including the quantum dots member 500 is improved.

Consequently, the backlight unit BLU and the display device 700 including the backlight unit BLU can improve an optical conversion characteristic thereof.

In one or more exemplary embodiment of the invention, the quantum dots member 500 has a planar size smaller than a quantum dots member cut to fit the size of the optical sheet 200 of the conventional backlight unit. That is, in one or more exemplary embodiment of the invention, a usable (e.g., light converting) area of the quantum dots member 500 is reduced. As the usable area of the quantum dots area 500 is reduced, an overall manufacturing cost of the backlight unit BLU is reduced. Thus, in one or more exemplary embodiment of the backlight unit BLU and the display device 700 including the backlight unit BLU, a manufacturing cost may be reduced compared to that of a conventional backlight unit.

The quantum dots member 500 of the backlight unit BLU is spaced the first distance L1 apart from the light source 400 and is inserted and fixed into the first groove G1 and the second groove G2 of the guide member 300. The first distance L1 is set to a distance at which the quantum dots member 500 is not deteriorated and not damaged by heat from the light source 400. Thus, in one or more exemplary embodiment of the invention, the backlight unit BLU and the display device 700 including the backlight unit BLU can reduce or effectively prevent deterioration of the quantum dots member 500.

Figure 4:
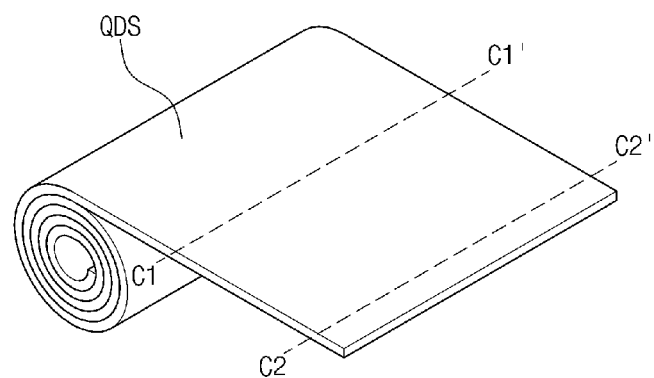
FIG. 4 is a perspective view illustrating an exemplary embodiment of a roll-shaped quantum dots member.

FIG. 4 is a perspective view of a roll-shaped quantum dots member.

Referring to FIG. 4, a bulk part quantum dots member QDS may be formed in a roll shape. The quantum dots member 500 of a predetermined area among the roll-shaped bulk part quantum dots member QDS is cut away to be used in the backlight unit BLU. In one exemplary embodiment, for instance, the quantum dots member 500 may be cut from the bulk part quantum dots member QDS along a first cutting-plane line C1-C1' and a second cutting-plane line C2-C2'.

Figure 5:
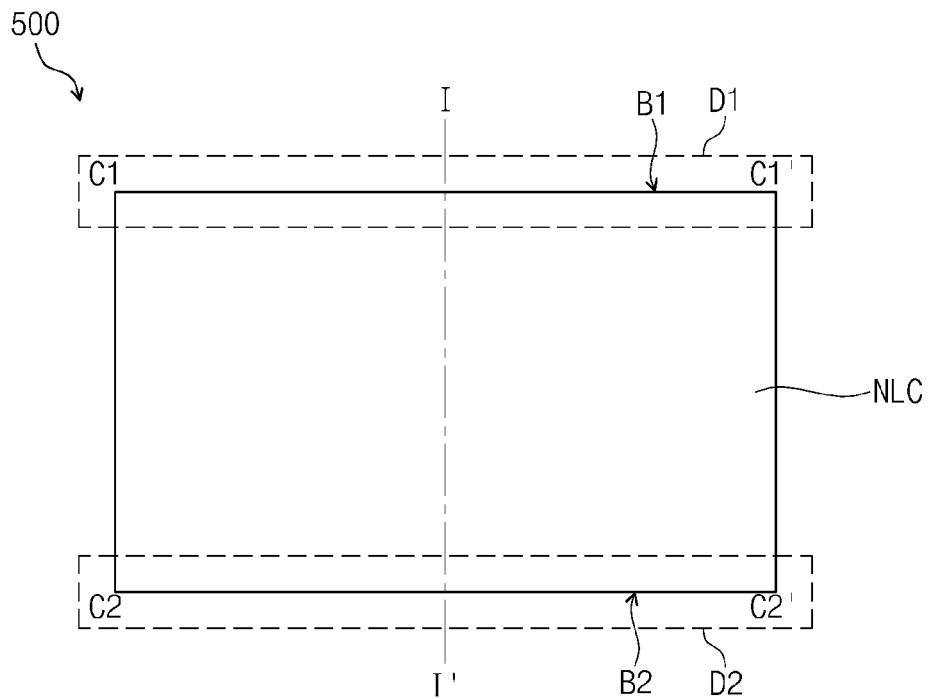
FIG. 5 is a plan view of the quantum dots member which has been separated from the roll-shaped part quantum dots member along the lines C1-C1' and C2-C2' in FIG. 4.
Figure 6:
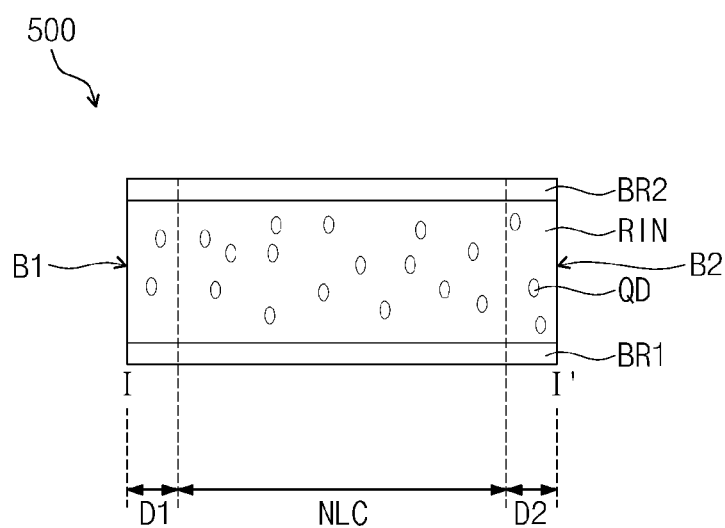
FIG. 6 is a cross sectional view of the quantum dots member taken along line I-I' illustrated in FIG. 5.

FIG. 5 is a plan view of the quantum dots member which has been cut from the roll-shaped bulk part quantum dots member QDS along the lines C1-C1' and C2-C2' illustrated in FIG. 4. FIG. 6 is a cross-sectional view of the quantum dots member taken along line I-I' illustrated in FIG. 5.

Referring to FIGS. 5 and 6, the quantum dots member 500 includes a first barrier layer BR1, a second barrier layer BR2, and quantum dots QD disposed between the first barrier layer BR1 and the second barrier layer BR2. The quantum dots QD are accommodated in a resin RN to be disposed between the first barrier layer BR1 and the second barrier layer BR2.

As described above, where the quantum dots member 500 converts blue light into white light, the quantum dots QD may include quantum dots QD having a first size absorbing light of a blue wavelength band to emit light of a green wavelength band and quantum dots QD having a second size absorbing light of a blue wavelength band to emit light of a red wavelength band.

A boundary surface of the quantum dots member 500 formed by the first cutting-plane line C1-C1' may be defined as a first boundary surface B1. A boundary surface of the quantum dots member 500 formed by the second cutting-plane line C2-C2' may be defined as a second boundary surface B2.

The first and second boundary surfaces B1 and B2 are exposed to external oxygen and moisture once the quantum dots member 500 is separated from the roll-shaped bulk part quantum dots member QDS. The quantum dots QD disposed in predetermined areas D1 and D2 of the quantum dots member 500 with respect to the first and second boundary surfaces B1 and B2 are exposed to external oxygen and moisture and an undesirable chemical reaction may occur. An optical conversion characteristic of the quantum dots QD in the predetermined areas D1 and D2 is degraded by the chemical reaction.

The predetermined area D1 of the quantum dots member 500 with respect to the first boundary surface B1 may be defined as a first defective area D1. The predetermined area D2 of the quantum dots member 500 with respect to the second boundary surface B2 may be defined as a second defective area D2. An area of the quantum dots member 500 disposed between the first defective area D1 and the second defective area D2 may be defined as an optical conversion area NLC. The quantum dots member 500 separated from the roll-shaped bulk part quantum dots member QDS shown in FIG. 5 includes a portion of the predetermined areas D1 and D2. A remainder of the predetermined areas are included in one or more adjacent quantum dots members 500 (not shown) and/or a remainder of the roll-shaped bulk part quantum dots member QDS.

The quantum dots QD disposed in the first and second defective areas D1 and D2 do not perform a normal optical conversion operation. Light which enters the first and second defective areas D1 and D2 may not be converted into the white light.

An optical conversion characteristic of the quantum dots QD disposed in the optical conversion area NLC is not degraded and performs a normal optical conversion operation. That is, the light which enters the light conversion area NLC can be converted into the white light.

Figure 7:
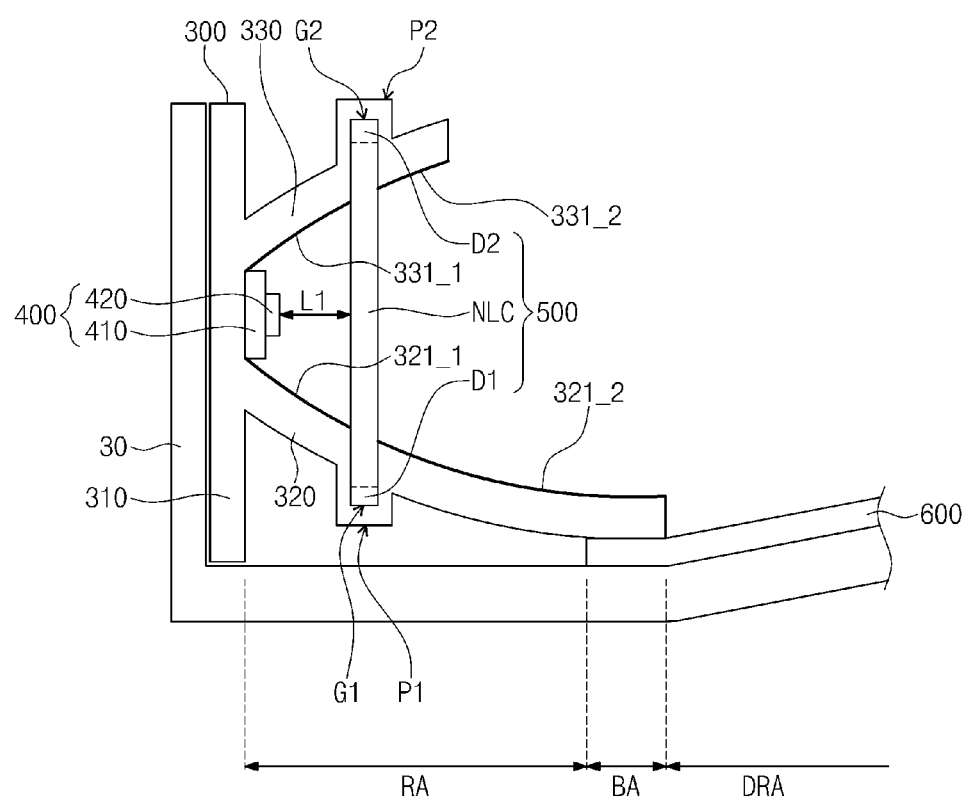
FIG. 7 is an enlarged cross-sectional view of an exemplary embodiment of the quantum dots member illustrated in FIGS. 5 and 6 combined with the guide member illustrated in FIG. 1

FIG. 7 is an enlarged cross-sectional view of an exemplary embodiment of the quantum dots member illustrated in FIGS. 5 and 6 and the guide member illustrated in FIG. 1 combined with each other.

Referring to FIG. 7, the first defective area D1 of the quantum dots member 500 is inserted into the first groove G1. The second defective area D2 of the quantum dots member 500 is inserted into the second groove G2.

The light generated by the light source 400 is not provided to the first groove G1 and the second groove G2. The first and second defective areas D1 and D2 of the quantum dots member 500 are inserted into the first and second grooves G1 and G2, respectively, to be blocked from the light generated by the light source 400. Thus, the light generated by the light source 400 is not provided to the first and second defective areas D1 and D2 of the quantum dots member 500. The light generated by the light source 400 is provided to the optical conversion area NLC of the quantum dots member 500.

Where light generated by the light source 400 is blue light, the first and second defective areas D1 and D2 of the quantum dots member 500 are inserted into the first and second grooves G1 and G2, respectively, to be blocked from the light and thereby the blue light is not provided to the first and second defective areas D1 and D2 of the quantum dots member 500. The first and second defective areas D1 and D2 of the quantum dots member 500 do not perform an optical conversion operation.

The blue light generated by the light source 400 is provided to the optical conversion area NLC of the quantum dots member 500. The optical conversion area NLC of the quantum dots member 500 performs a normal optical conversion operation to convert the blue light into the white light.

The first and second defective areas D1 and D2 of the quantum dots member 500 in which quantum dots of which an optical conversion characteristic is degraded are disposed, do not emit the blue light. The optical conversion area NLC converts the blue light into white light to emit the white light. Thus, an optical conversion characteristic of one or more exemplary embodiment of the backlight unit BLU including the quantum dots member 500 is improved.

Consequently, one or more exemplary embodiment of the backlight unit BLU and the display device 700 including the backlight unit BLU can improve an optical conversion characteristic.

Figure 8:
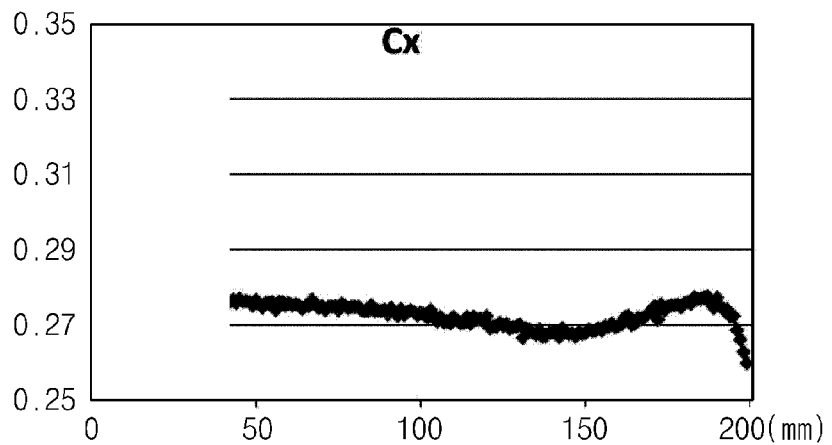
FIGS. 8 and 9 are graphs illustrating an exemplary embodiment of a color coordinate generated from the backlight unit illustrated in FIG. 1.
Figure 9:
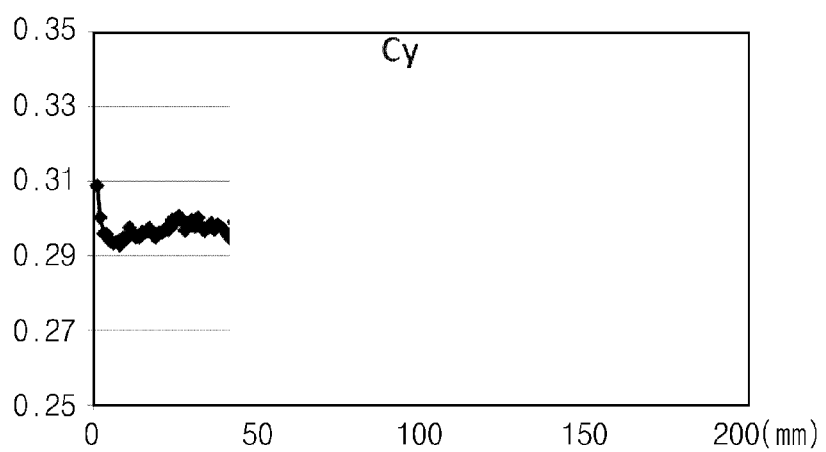

FIGS. 8 and 9 are graphs illustrating an exemplary embodiment of a color coordinate generated from the backlight unit illustrated in FIG. 1. FIG. 8 is a graph illustrating an X coordinate among color coordinates and FIG. 9 is a graph illustrating a Y coordinate among color coordinates.

In graphs Cx and Cy illustrated in FIGS. 8 and 9, a horizontal axis represents a distance (millimeter: mm) from the light source 400. A vertical axis in the graph Cx illustrated in FIG. 8 represents an X coordinate among the color coordinates. A vertical axis in the graph Cy illustrated in FIG. 9 represents a Y coordinate among the color coordinates.

Referring to FIGS. 8 and 9, even though distance from the light source 400 increases, amount of change in the X coordinate and the Y coordinate of color coordinates of light generated by the backlight unit BLU is minimal. In general, as the amount of change in the X coordinate and the Y coordinate increases, color uniformity decreases. As color uniformity decreases, normal white light may not be generated.

However, the amount of change in the X coordinate and the Y coordinate of color coordinates of light generated by the backlight unit BLU is minimal. The color coordinate illustrate in FIGS. 8 and 9 represents that the color uniformity of light generated by the backlight unit BLU is good. This result represents that normal white light is generated by the quantum dots member 500.

Figure 10:
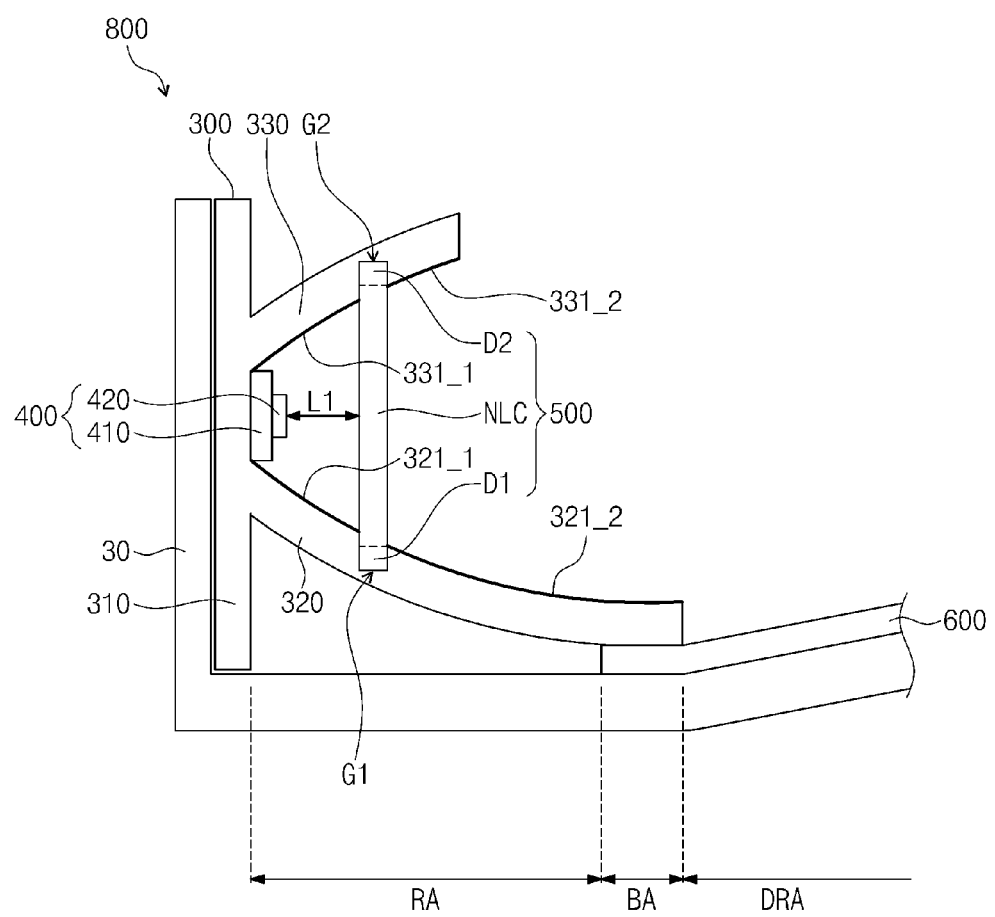
FIG. 10 is an enlarged cross-sectional view of another exemplary embodiment of a display device in accordance with the invention.

FIG. 10 is an enlarged cross-sectional view another exemplary embodiment of a display device in accordance with the invention.

The display device 800 illustrated in FIG. 10 is substantially the same as the display device 700 illustrated in FIG. 1 except for a guide member. Thus, only the differences of the guide member 300 illustrated in FIG. 10 will be described below.

Referring to FIG. 10, a first reflection part 320 of the guide member 300 of the display device 800 includes a first groove G1, a first sub-reflection surface 321_1 and a second sub-reflection surface 321_2. A second reflection part 330 includes a second groove G2, a third sub-reflection surface 331_1 and a fourth sub-reflection surface 331_2.

The first groove G1 is spaced apart from a light source 400 along the second direction DY by the first distance L1 and is recessed downward from a top surface of the first reflection part 320. A depth of the first groove G1 is smaller than a thickness of the first reflection part 320.

The second groove G2 is spaced apart from the light source 400 along the second direction DY by the first distance L1 and is recessed upward from a bottom surface of the second reflection part 330. A depth of the second groove G2 is smaller than a thickness of the second reflection part 330.

Different from the exemplary embodiment in FIG. 1, the guide member 300 in FIG. 10 does not include protrusion parts which define a portion of the first and second grooves G1 and G2. In the illustrated exemplary embodiment of FIG. 10, the first and second grooves G1 and G2 are partially recessed into a thickness of the first and second reflection parts 320 and 330, respectively.

A first defective area D1 of a quantum dots member 500 is inserted into the first groove G1. A second defective area D2 of the quantum dots member 500 is inserted into the second groove G2.

Light generated by the light source 400 is not provided to the first and second grooves G1 and G2. That is, the first and second defective areas D1 and D2 of the quantum dots member 500 are inserted into the first and second grooves G1 and G2, respectively, to be blocked from the light. Thus, the light generated by the light source 400 is not provided to the first and second defective areas D1 and D2 of the quantum dots member 500. The light generated by the light source 400 is provided to an optical conversion area NLC of the quantum dots member 500.

The display device 800 can improve an optical conversion characteristic, reduce a manufacturing cost and prevent deterioration of the quantum dots member.

Figure 11:
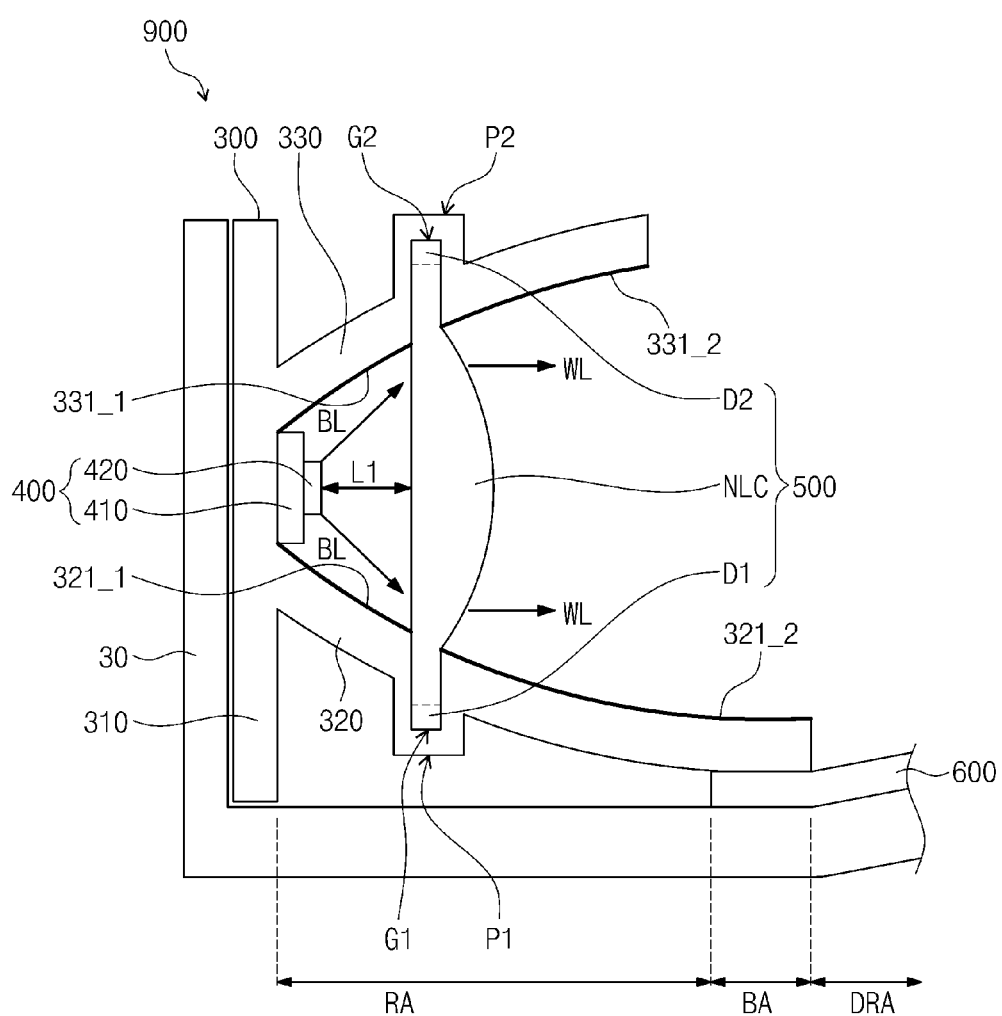
FIG. 11 is an enlarged cross-sectional view of still another exemplary embodiment of a display device in accordance with the invention.

FIG. 11 is an enlarged cross-sectional view of still another exemplary embodiment of a display device in accordance with the invention.

The display device 900 illustrated in FIG. 11 is substantially the same as the display device 700 illustrated in FIG. 1 except for a quantum dots member. Thus, only the differences of the quantum dots member 500 illustrated in FIG. 11 will be described below.

Referring to FIG. 11, an optical conversion area NLC of the quantum dots member 500 of the display device 900 has a convex shape protruded away from a light source 400. In the optical conversion area NLC, a light incident first surface of the quantum dots member 500 is substantially flat and parallel to the inner surface of the body part 310 while facing the light source 400, and a light exiting second surface opposing the light incident surface of the quantum dots member 500 has the convex shape. Thus, the second side of the quantum dots member 500 may be used as a convex lens.

Where blue light BL is generated by the light source 400, the blue light BL is converted into white light WL in the optical conversion area NLC of the quantum dots member 500. The white light WL being emitted from the optical conversion area NLC may be guided in a second direction DY as light having a strong linearity due to the second side of the quantum dots member 500 having the convex shape. That is, light provided from the light source 400 may be guided to be light having a strong linearity by the second side of the quantum dots member 500 having the convex shape.

Consequently, the display device 900 can improve linearity of light generated by the light source 400. The display device 900 can improve an optical conversion characteristic, reduce a manufacturing cost and prevent deterioration of the quantum dots member.

The above-disclosed subject matter is to be considered illustrative, and not restrictive, and the appended claims are intended to cover all such modifications, enhancements, and other embodiments, which fall within the true spirit and scope of the invention. Thus, to the maximum extent allowed by law, the scope of the invention is to be determined by the broadest permissible interpretation of the following claims and their equivalents, and shall not be restricted or limited by the foregoing detailed description.

What is claimed is:

1. A backlight unit comprising:
   a light source which generates a first light;
   a quantum dots member which is spaced apart from the light source by a first distance and converts the first light into a second light;
   a guide member which lengthwise extends in a first direction, accommodates the light source and the quantum dots member therein, and fixes positions of the light source and the quantum dots member; and
   an optical member which reflects the second light,
      wherein the guide member guides the first light from the light source to the quantum dots member and guides the second light from the quantum dots member to the optical member.

2. The backlight unit of claim 1, further comprising an optical sheet which is above the guide member and the optical member, redirects the second light into a third light and provides the third light to a display panel.

3. The backlight unit of claim 2, wherein the first light is a blue light, the second light is a white light, and the optical sheet diffuses the white light from the optical member and concentrates the white light in a direction perpendicular to a plane of the display panel to generate the third light.

4. The backlight unit of claim 1, wherein the guide member comprises:
   a body part which is perpendicular to a bottom part of a protection member accommodating the backlight unit, disposed at a side wall part of the protection member, and lengthwise extends in the first direction; and
   a first reflection part and a second reflection part each extending from an inner surface of the body part toward the optical member, in a second direction substantially perpendicular to the first direction, and having substantially a same length as the body part in the first direction.

5. The backlight unit of claim 4, wherein
   the first and second reflection parts each guide the first light from the light source to the quantum dots member and the second light to the optical member,
   first sides of the first and second reflection parts at the inner surface of the body part are adjacent to each other,
   the first and second reflection parts extend further than the first distance along the second direction,
   as a second-direction distance from the body part increases, a distance between the first and second reflection parts increases in a third direction perpendicular to the first and second directions, and
   the first reflection part extends further than the second reflection part in the second direction.

6. The backlight unit of claim 5, wherein
   the first reflection part and the second reflection part each have a curved shape, and
   a predetermined area of a top surface of the first reflection part, taken from the inner surface of the body part, faces a bottom surface of the second reflection part.

7. The backlight unit of claim 5, wherein
   the light source is fixed to the inner surface of the body part between the adjacent first sides of the first and second reflection parts, and
   the quantum dots member is fixed to the first and second reflection parts and spaced apart from the light source by the first distance.

8. The backlight unit of claim 7, wherein the first reflection part comprises:
   a first groove defined spaced apart from the light source by the first distance along the second direction, and recessed downward from a top surface of the first reflection part;
   a first protrusion part which defines a portion of the first groove and protrudes downward from a bottom surface of the first reflection part; and
   a first reflection surface which is on the top surface of the first reflection part except an area in which the first groove is defined, and reflects the first light and the second light to guide the first light and the second light in the second direction.

9. The backlight unit of claim 8, wherein the second reflection part comprises:
   a second groove defined spaced apart from the light source by the first distance along the second direction, and recessed upward from a bottom surface of the second reflection part;
   a second protrusion part which defines a portion of the second groove and protrudes upward from a top surface of the second reflection part; and
   a second reflection surface which is on the bottom surface of the second reflection part except an area in which the second groove is defined, and reflects the first light and the second light to guide the first light and the second light in the second direction.

10. The backlight unit of claim 9, wherein a predetermined area of a first side of the optical member overlaps a predetermined area of a distal second side of the first reflection part opposite to the first side thereof.

11. The backlight unit of claim 10, wherein the predetermined area of the first side of the optical member is under the predetermined area of the distal second side of the first reflection part.

12. The backlight unit of claim 9, wherein the quantum dots member is perpendicular to the plane and lengthwise extends in the first direction, and upper and lower ends of the quantum dots member are respectively in the first groove and the second groove.

13. The backlight unit of claim 12, wherein the quantum dots member comprises:
a first defective area at the lower end and defined as a predetermined area taken from a lower boundary surface of the quantum dots member;
a second defective area at the upper end and defined as a predetermined area taken from an upper boundary surface of the quantum dots member; and
an optical conversion area which is defined as an area between the first and second defective areas, and converts the first light into the second light,
wherein the first defective area is in the first groove and the second defective area is in the second groove.

14. The backlight unit of claim 13, wherein in the optical conversion area of the quantum dots member comprises:
a light incident surface which is substantially flat and faces the light source, and
a light exiting surface which opposes the light incident surface and has a convex shape.

15. The backlight unit of claim 9, wherein the first and second reflection surfaces comprise a metal layer comprising silver.

16. The backlight unit of claim 9, wherein
the first reflection surface comprises:
a first sub-reflection surface between the first side of the first reflection part and the first groove; and
a second sub-reflection surface between the first groove and a distal second side of the first reflection part opposite to the first side thereof, and the second reflection surface comprises:
a third sub-reflection surface between the first side of the second reflection part and the second groove; and
a fourth sub-reflection surface between the second groove and a distal second side of the second reflection part opposite to the first side thereof.

17. The backlight unit of claim 16, wherein
the first light is reflected by the first sub-reflection surface and the third sub-reflection surface and guided in the second direction, and
the second light is reflected by the second sub-reflection surface and the fourth sub-reflection surface and guided in the second direction.

18. The backlight unit of claim 9, wherein
the first reflection surface and the second reflection surface form a portion of an ellipse on a plane taken along the third direction,
the light source is aligned with a major axis line of the ellipse, and
the major axis line connects focal points of the ellipse.

19. The backlight unit of claim 7, wherein
the first reflection part comprises:
a first groove defined spaced apart from the light source by the first distance in the second direction, and recessed downward from a top surface of the first reflection part; and
a first reflection surface which is on the top surface of the first reflection part except an area in which the first groove is defined, and reflects the first light and the second light to guide the first light and the second light in the second direction, the second reflection part comprises:
a second groove defined spaced apart from the light source by the first distance in the second direction, and recessed upward from a bottom surface of the second reflection part; and
a second reflection surface which is on the bottom surface of the second reflection part except an area in which the second groove is defined, and reflects the first light and the second light to guide the first light and the second light in the second direction, and
upper and lower ends of the quantum dots member are respectively in the first groove and the second groove.

20. The backlight unit of claim 1, wherein the light source comprises a plurality of light source units which is spaced apart from each other by a predetermined distance in the first direction and generates a blue light.

21. The backlight unit of claim 20, wherein the quantum dots member comprises:
quantum dots which have a first size absorbing light in a blue wavelength band and emit light in a green wavelength band; and
quantum dots which have a second size absorbing light in the blue wavelength band and emit light in a red wavelength band.

22. The backlight unit of claim 1, wherein the first distance is equal to or greater than 0.3 millimeter.

23. A display device comprising:
a display panel which generates an image by controlling a penetration ratio of light; and
a backlight unit which is at a lower portion of the display panel and provides the light to the display panel,
wherein the backlight unit comprises:
a light source which generates a first light;
a quantum dots member which is spaced apart from the light source by a first distance and converts the first light into a second light;
a guide member which lengthwise extends in a first direction and fixes positions of the light source and the quantum dots member;
an optical member which reflects the second light; and
an optical sheet which is above the guide member and the optical member, redirects the second light into the light and provides the light to the display panel,
wherein the guide member guides the first light from the light source to the quantum dots member and guides the second light from the quantum dots member to the optical member.

24. The display device of claim 23, wherein the first light is a blue light, the second light is a white light, and the optical sheet diffuses the white light from the optical member and concentrates the white light in a direction perpendicular to a plane of the display panel to generate the light.

25. The display device of claim 23, wherein the guide member comprises:
a body part which is perpendicular to a bottom part of a protection member accommodating the backlight unit, disposed at a side wall part of the protection member, and lengthwise extends in the first direction; and
a first reflection part and a second reflection part each extending from an inner surface of the body part toward the optical member, in a second direction substantially perpendicular to the first direction, and having substantially a same length as the body part in the first direction.

26. The backlight unit of claim 25, wherein the first and second reflection parts each guide the first light from the light source to the quantum dots member and the second light to the optical member,
first sides of the first and second reflection parts at the inner surface of the body part are adjacent to each other, the first and second reflection parts extend further than the first distance along the second direction, as a second-direction distance from the body part increases, a distance between the first and second reflection parts increases in a third direction perpendicular to the first and second directions, and the first reflection part extends further than the second reflection part in the second direction.

27. The display device of claim 26, wherein the first reflection part and the second reflection part each have a curved shape, a predetermined area of a top surface of the first reflection part, taken from the inner surface of the body part, faces a bottom surface of the second reflection part, the light source is fixed to the inner surface of the body part between the adjacent first sides of the first and second reflection parts, and the quantum dots member is fixed to the first and second reflection parts and spaced apart from the light source by the first distance.

28. The display device of claim 27, wherein the first reflection part comprises:
 a first groove defined spaced apart from the light source by the first distance along the second direction, and recessed downward from the top surface of the first reflection part;
 a first protrusion part which defines a portion of the first groove and protrudes downward from a bottom surface of the first reflection part; and
 a first reflection surface which is on the top surface of the first reflection part except an area in which the first groove is defined and reflects the first light and the second light to guide the first light and the second light in the second direction, and the second reflection part comprises:
 a second groove defined spaced apart from the light source by the first distance along the second direction, and recessed upward from the bottom surface of the second reflection part;
 a second protrusion part which defines a portion of the second groove and protrudes upward from a top surface of the second reflection part; and
 a second reflection surface which is on the bottom surface of the second reflection part except an area in which the second groove is defined and reflects the first light and the second light to guide the first light and the second light in the second direction.

29. The display device of claim 28, wherein the quantum dots member is perpendicular to the plane and lengthwise extends in the first direction, and comprises:
 a first defective area at a lower end and defined as a predetermined area taken from a lower boundary surface of the quantum dots member;
 a second defective area at an upper end and defined as a predetermined area taken from an upper boundary surface of the quantum dots member; and
 an optical conversion area which is defined as an area between the first and second defective areas and converts the first light into the second light, wherein the first defective area is in the first groove and the second defective area is in the second groove.

30. The display device of claim 29, wherein in the optical conversion area of the quantum dots member comprises:
 a light incident surface which is substantially flat and faces the light source, and
 a light exiting surface which opposes the light incident surface and has a convex shape.

31. The display device of claim 28, wherein the first reflection surface comprises:
 a first sub-reflection surface between the first side of the first reflection part and the first groove; and
 a second sub-reflection surface between the first groove and a distal second side of the first reflection part opposite to the first side thereof, and the second reflection surface comprises:
 a third sub-reflection surface between the first side of the second reflection part and the second groove; and
 a fourth sub-reflection surface between the second groove and a distal second side of the second reflection part opposite to the first side thereof.

32. The display device of claim 31, wherein the first light is reflected by the first sub-reflection surface and the third sub-reflection surface and guided in the second direction, and the second light is reflected by the second sub-reflection surface and the fourth sub-reflection surface and guided in the second direction.

33. The display device of claim 28, wherein the first reflection surface and the second reflection surface form a portion of an ellipse on a plane taken along the third direction, the light source is aligned on a major axis line of the ellipse, and the major axis line connects focal points of the ellipse.

34. The display device of claim 23, wherein the light source comprises a plurality of light source units which is spaced apart from each other by a predetermined distance in the first direction and generates a blue light, and the quantum dots member comprises:
 quantum dots which have a first size absorbing light in a blue wavelength band and emit light in a green wavelength band; and
 quantum dots which haves a second size absorbing light in the blue wavelength band and emit light in a red wavelength band.

35. The display device of claim 23, wherein the first distance is equal to or greater than 0.3 millimeter.

* * * * *